United States Patent
Iwase et al.

(10) Patent No.: US 10,687,451 B2
(45) Date of Patent: Jun. 16, 2020

(54) MAINTENANCE MANAGEMENT DEVICE AND MAINTENANCE MANAGEMENT METHOD OF COMPONENT MOUNTING MACHINE

(71) Applicant: FUJI CORPORATION, Chiryu (JP)

(72) Inventors: Tomonori Iwase, Gamagoori (JP); Makoto Nishi, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 812 days.

(21) Appl. No.: 15/123,834

(22) PCT Filed: Mar. 7, 2014

(86) PCT No.: PCT/JP2014/055953
§ 371 (c)(1),
(2) Date: Sep. 6, 2016

(87) PCT Pub. No.: WO2015/132950
PCT Pub. Date: Sep. 11, 2015

(65) Prior Publication Data
US 2017/0020041 A1   Jan. 19, 2017

(51) Int. Cl.
*H05K 13/08* (2006.01)
*G06Q 10/00* (2012.01)

(52) U.S. Cl.
CPC ......... *H05K 13/08* (2013.01); *G06Q 10/20* (2013.01); *H05K 13/087* (2018.08);
(Continued)

(58) Field of Classification Search
CPC .. G05B 19/41865; B23Q 41/08; B65G 25/04; H05K 13/08; H05K 13/0857;
(Continued)

(56) References Cited

U.S. PATENT DOCUMENTS

| | | | |
|---|---|---|---|
| 2002/0013639 A1* | 1/2002 | Fujishima | B23Q 41/08 700/175 |
| 2008/0147232 A1* | 6/2008 | Kuribayashi | H05K 13/0895 700/160 |

(Continued)

FOREIGN PATENT DOCUMENTS

| | | |
|---|---|---|
| JP | 2004-140162 A | 5/2004 |
| WO | 2004/86841 A1 | 10/2004 |
| WO | WO 2013/175677 A1 | 11/2013 |

OTHER PUBLICATIONS

Extended European Search Report dated Feb. 9, 2017 in Patent Application No. 14884854.2.
(Continued)

*Primary Examiner* — Robert E Fennema
*Assistant Examiner* — Jonathan Michael Skrzycki
(74) *Attorney, Agent, or Firm* — Oblon, McClelland, Maier & Neustadt, L.L.P.

(57) ABSTRACT

A maintenance management device which individually manages maintenance times at which to perform maintenance using a plurality of constituent elements, which are equipped in an exchangeable manner to a plurality of equipment positions of a component mounting machine to operate, as management targets, and the maintenance management device includes a remaining operation number calculating section which calculates respective remaining operation numbers of each of the plurality of constituent elements, an operation frequency ascertaining section which ascertains respective operation frequencies of the constituent elements at the plurality of equipment positions according to a type of the board, and a guide section which performs guidance of equipment positions of the constituent elements based on the remaining operation number and the operation frequency when a worker equips the constituent elements.

19 Claims, 3 Drawing Sheets

(52) U.S. Cl.
CPC ..... *H05K 13/0857* (2018.08); *H05K 13/0895* (2018.08); *Y02P 90/86* (2015.11)

(58) Field of Classification Search
CPC .. H05K 13/0895; H05K 13/087; G06Q 10/20; Y02P 90/86
See application file for complete search history.

(56) References Cited

U.S. PATENT DOCUMENTS

| | | | |
|---|---|---|---|
| 2008/0154392 A1* | 6/2008 | Maenishi ........... | H05K 13/0853 700/32 |
| 2010/0116625 A1* | 5/2010 | Larsson ................ | B65G 25/04 198/763 |
| 2014/0265606 A1* | 9/2014 | Gazit .................. | H02M 3/1582 307/82 |
| 2015/0039115 A1* | 2/2015 | Sagara ............. | G05B 19/41865 700/106 |
| 2015/0095082 A1* | 4/2015 | Guntin ........... | G06Q 10/063114 705/7.15 |
| 2015/0173205 A1* | 6/2015 | Maenishi ......... | G05B 19/41865 29/832 |

OTHER PUBLICATIONS

International Search Report dated May 13, 2014 in PCT/JP2014/055953 filed Mar. 7, 2014.

* cited by examiner

MAINTENANCE MANAGEMENT DEVICE AND MAINTENANCE MANAGEMENT METHOD OF COMPONENT MOUNTING MACHINE

TECHNICAL FIELD

The present application relates to the technical field of a component mounting machine which mounts electronic components onto a board. More specifically, the present application relates to a maintenance management device and a maintenance management method which manage, on an individual basis, the maintenance times of constituent elements which are equipped to equipment positions of the component mounting machine in an exchangeable manner.

BACKGROUND ART

Examples of devices which produce a board onto which multiple electronic components are mounted include a solder printer, a component mounting machine, a reflow furnace, and aboard inspection machine. There are many cases in which these devices are linked up to construct a board production line. There is a case in which the component mounting line is configured by providing a plurality of component mounting machines to line up. This type of component mounting machine is generally provided with a component supply device and a component transfer device. A feeder device, which is a typical component supply device, is provided with a driving mechanism which sequentially pulls out a tape storing electronic components in a single row. Since the driving mechanism includes movable sections, it is recommended to carry out regular maintenance of the feeder device. The component transfer device is provided with a mounting nozzle and a mounting head in order to suck and pick up an electronic component and mount the electronic component onto a board. It is also recommended that the mounting nozzle and the mounting head are subjected to regular maintenance.

The feeder device, the mounting nozzle, the mounting head, and the like described above are constituent elements which are equipped to the equipment positions of the component mounting machine in an exchangeable manner to operate. In order to increase production efficiency, there are many cases in which multiple of each of the constituent elements are prepared in advance and stored, and the constituent elements are exchanged and equipped, as appropriate, according to the type of the board to be produced. Maintenance of these constituent elements is carried out after removing the constituent elements from the equipment positions of the component mounting machine. At this time, it is possible to shorten production interruption time by providing another constituent element which has already been subjected to maintenance. Examples of techniques managing the time at which to carry out maintenance (a maintenance time) targeting the constituent elements of the component mounting machine are disclosed in PTL 1 and PTL 2.

The maintenance method of the electronic circuit component mounting machine disclosed in PTL 1 intensively performs maintenance on the constituent elements of a plurality of electronic circuit component mounting machines which are installed in a plurality of factories. Accordingly, it is presumed that the maintenance may be performed efficiently, and that the production efficiency is improved through a reduction in maintenance costs. In an embodiment, it is further disclosed that a feeder is identified using a feeder ID (an identification code) of a bar code provided on each of a plurality of feeders (component supply devices). Regarding a single feeder, in a case in which a number of component supply times is greater than or equal to a set number or in a case in which a supply error occurrence number is greater than or equal to a set number, it is determined that the feeder is unsuitable for use and maintenance is necessary.

A maintenance work support system for a component mounting system disclosed by the present applicant in PTL 2 includes a maintenance data storage section, and a maintenance work plan creation section. The maintenance data storage section stores maintenance data including maintenance work items and mounting frequency thereof for the maintenance targets of a plurality of mounting-related work devices. The maintenance work plan creation section creates a plan of maintenance work of a maintenance target based on the maintenance data. Accordingly, since a plurality of mounting-related work devices are targeted, this is convenient, unlike a system of the related art in which a single mounting-related work device is targeted. It is possible to prevent forgetting of maintenance, excessive maintenance, and the like, to perform highly efficient maintenance work.

CITATION LIST

Patent Literature

PTL 1: JP-A-2004-140162
PTL 2: International Publication No. 2004/086841

SUMMARY

Incidentally, in the techniques of PTL 1 and PTL 2, a point in which a worker is given guidance of a maintenance time of constituent elements of a component mounting machine is preferable. However, the maintenance efficiency may decrease if the constituent elements are only exchanged and equipped one by one according to the guidance. For example, if a plurality of the constituent elements are equipped at random without considering the maintenance times, the following maintenance times arrive sporadically, and the labor of the worker in charge of the maintenance increases. Since the maintenance time arrives frequently in the middle of production work, the production efficiency is reduced. Conversely, that is to say that if it is possible to carry out the maintenance of a plurality of the constituent elements together at the same time, it is possible to improve the maintenance efficiency, and it is possible to contribute to an improvement in production efficiency.

Meanwhile, when changing the type of the board to be produced, the worker performs setup changing work of selecting and equipping the constituent elements which are appropriate for the type of the board. At this time, since the component type of the electronic components to be mounted on the board changes, it becomes necessary to exchange and equip the feeder device. Since the size and the number of the electronic components to be mounted change according to the type of the board, accordingly exchanging and equipping the mounting nozzle and the mounting head also arises. In this manner, exchanging and equipping many of the constituent elements is frequent in the setup changing work when changing the type of the board. Here, the subsequent maintenance efficiency changes greatly depending on the workmanship of a selection method of the constituent elements to be newly equipped and a determination method of the equipment positions.

Neither PTL 1 nor PTL 2 discloses a method of selecting the constituent elements to be newly equipped or a method of determining the equipment positions when a specific constituent element reaches the maintenance time, or when the type of the board to be produced is changed. Since it is possible to predict the next maintenance time of each of the constituent elements from various information, it is possible to select the constituent element in consideration thereof and determine the equipment positions, and thus an improvement in the efficiency of the maintenance is anticipated. In particular, bringing the maintenance of a plurality of the constituent elements closer to the same time, that is, concentration of the maintenance times is an important factor for improving the efficiency of the maintenance.

The present disclosure is made in consideration of the problems of the background art described above, and an object of the present disclosure is to provide a maintenance management device and a maintenance management method of a component mounting machine which improve the efficiency of maintenance and contribute to an improvement in production efficiency by providing guidance of equipment positions in consideration of maintenance times of constituent elements to be equipped to the component mounting machine.

The disclosure of a maintenance management device of a component mounting machine according to an aspect which solves the problems described above is a maintenance management device of a component mounting machine which individually manages maintenance times at which to perform maintenance and performs guidance of reaching the maintenance times using a plurality of constituent elements, which are equipped in an exchangeable manner to a plurality of equipment positions of one or more component mounting machines which mount electronic components onto a board and operate, the maintenance management device including a remaining operation number calculating section which, for the plurality of constituent elements, uses an upper limit value of an operation number recommended in an interval period of the maintenance as a defined operation number, uses a number of operations since the previous maintenance as an actual operation number, and calculates a remaining operation number of each of the constituent elements based on the defined operation number and the actual operation number, an operation frequency ascertaining section which ascertains respective operation frequencies of the constituent elements at the plurality of equipment positions according to a type of the board, and a guide section which performs guidance of equipment positions of the constituent elements based on the remaining operation number and the operation frequency when a worker equips the constituent elements as a result of a change in the type of the board, or, as a result of a portion of the constituent elements which are equipped to the equipment positions reaching the maintenance time.

Accordingly, the guide section performs guidance of the equipment positions of the constituent elements in consideration of the remaining operation numbers recommended until the next maintenance of the constituent elements, and the operation frequencies at the equipment positions. Therefore, the worker is capable of equipping the constituent elements to the equipment positions according to the guidance for which the maintenance times are considered, and the efficiency of the maintenance of the constituent elements is improved. The improvement in the efficiency of the maintenance contributes to an improvement in production efficiency.

The disclosure of a maintenance management method of a component mounting machine according to another aspect is a maintenance management method of a component mounting machine which individually manages maintenance times at which to perform maintenance and performs guidance of reaching the maintenance times using, as management targets, a plurality of constituent elements which are equipped in an exchangeable manner to a plurality of equipment positions of one or more component mounting machines which mount electronic components onto a board and operate, the method including a remaining operation number calculating step of, for the plurality of constituent elements, using an upper limit value of an operation number recommended in an interval period of the maintenance as a defined operation number, using a number of operations since the previous maintenance as an actual operation number, and calculating a remaining operation number of each of the constituent elements based on the defined operation number and the actual operation number; an operation frequency ascertaining step of ascertaining respective operation frequencies of the constituent elements at the plurality of equipment positions according to a type of the board; and a guide step of performing guidance of equipment positions of the constituent elements based on the remaining operation number and the operation frequency when a worker equips the constituent elements as a result of a change in the type of the board, or, as a result of a portion of the constituent elements which are equipped to the equipment positions reaching the maintenance time.

Accordingly, it is possible to embody the disclosure of the maintenance management device of the component mounting machine according to an aspect as the embodiment of the maintenance management method of the component mounting machine according to another aspect. Even with the embodiment of the method according to the other aspect, the same effects arise as in the embodiment of the device according to the aspect.

DESCRIPTION OF EMBODIMENTS

Figure 1:
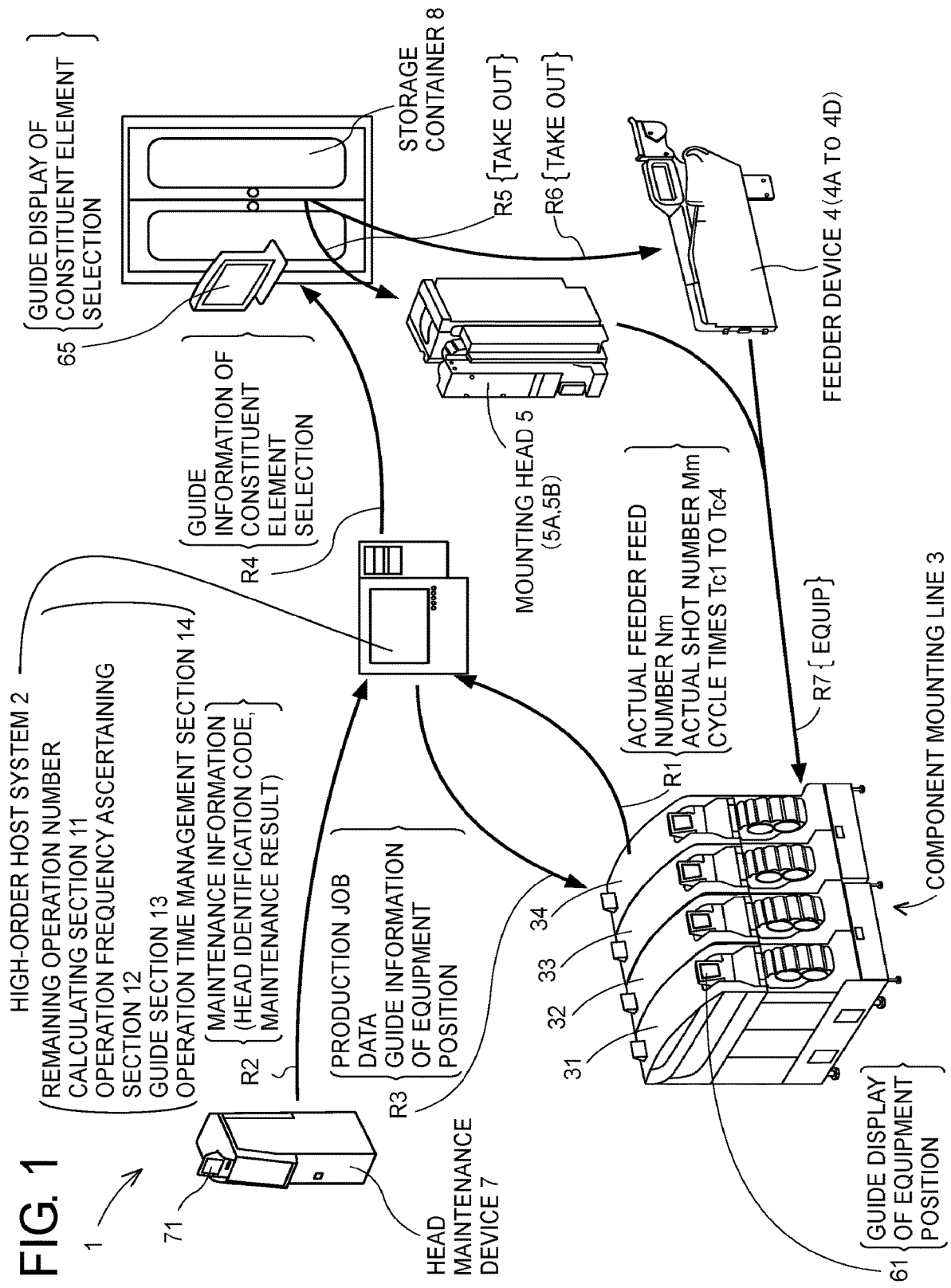
FIG. 1 is a diagram explaining a maintenance management device of a component mounting machine of an embodiment.

Description will be given of a maintenance management device 1 of a component mounting machine of the embodiment of the present disclosure with reference to FIGS. 1 to 3. FIG. 1 is a diagram explaining the maintenance management device 1 of the component mounting machine of the embodiment. The maintenance management device 1 of the embodiment is configured to be incorporated into a board production line. In addition to four first to fourth component mounting machines 31 to 34 depicted in FIG. 1, the board production line is configured to include a solder printer, a solder inspector, a board appearance inspection machine, and the like which are not illustrated in the drawings and are provided to line up. A high-order host system 2 is provided in order to control the operations of the entire board production line. The maintenance management device 1 of the component mounting machine of the embodiment is realized by including a maintenance management program which is executed by the high-order host system 2. First, description will be given of the overall configuration of the board production line.

The four first to fourth component mounting machines 31 to 34 are modularized devices of the same type, and are provided to line up to configure a component mounting line 3. The board is carried from the solder inspector to the first component mounting machine 31, and predetermined electronic components are mounted thereon. Subsequently, the board is conveyed sequentially to the second to the fourth component mounting machines 32 to 34, predetermined electronic components are mounted thereon in each, and subsequently, the board is conveyed to the board appearance inspection machine. Each of the component mounting machines 31 to 34 performs transferring of various data with the high-order host system 2 to which the component mounting machines 31 to 34 are connected to be capable of communication. The number of the component mounting machines 31 to 34 is not limited to four, and may be 1 or greater than or equal to 5. Each of the component mounting machines 31 to 34 is provided with a board conveyance device, a plurality of feeder devices 4, a component transfer device, and a monitor device 61. The board conveyance device performs the carrying in, the carrying out, and the positioning of the board.

Each of the plurality of feeder devices 4 is a feeder type component supply device, and each sequentially supplies a plurality of electronic components to a predetermined supply position. Each of the feeder devices 4 holds a reel in a reel holding section not illustrated in FIG. 1. A tape in which multiple electronic components are stored in a row is wound around the reel. Each of the feeder devices 4 is provided with a driving mechanism which feeds the tape and sequentially sets the electronic components in the supply position. The plurality of feeder devices 4 are respectively inserted into a plurality of slots (equipment positions) which are formed parallel to the top face of a mounting table of each of the component mounting machines 31 to 34, and are equipped in an exchangeable manner. Each of the feeder devices 4 may be equipped at any slot position of any mounting table of the four component mounting machines 31 to 34, that is, the feeder devices 4 are inter-compatible with the slot positions of the four component mounting machines 31 to 34.

Each of the feeder devices 4 is given a feeder identification code which identifies the individual feeder device 4. Each of the reels is given a device code which identifies the component type of the electronic components. A code reader not shown in the drawings is provided in the component mounting machines 31 to 34 in order to read at least one of the feeder identification code and the device code. The control sections, not illustrated in the drawings, of the component mounting machines 31 to 34 recognize the feeder identification code via a communication function between the control section and the feeder device 4 or via the code reader. Accordingly, the control sections of the component mounting machines 31 to 34 ascertain the individual feeder devices 4 which are equipped associated with the slot positions.

The control sections of the component mounting machines 31 to 34 recognize the device code via the code reader. Accordingly, the control sections of the component mounting machines 31 to 34 ascertain the correspondence relationship between the device code which indicates the component type of the electronic components which are stored in a reel, and the feeder identification code of the feeder device 4 which is holding the reel. The data of the feeder identification code and the device code is transmitted by communication to the high-order host system 2 and is shared.

The driving mechanism of the feeder device 4 is likely to undergo a reduction in performance in accordance with an increase in an actual operation number of feeding the tape to supply an electronic component, that is, in accordance with an increase in an actual feeder feed number Nm. Therefore, it is recommended to perform the maintenance of the feeder device 4 at a point in time at which a number of the electronic components which are fed is equal to a predetermined defined feeder feed number Nk. The defined feeder feed number Nk is an upper limit value of the recommended operation number in a maintenance interval period, and corresponds to a defined operation number of the present disclosure. Examples of maintenance items of the feeder device 4 include inspection and cleaning of the driving mechanism, replenishing of lubricant in the movable sections, and the like.

The component transfer device receives the electronic components from each of the supply positions of the plurality of feeder devices 4 which are equipped, and mounts the electronic components at specified positions on the board which is positioned by the board conveyance device. The component transfer device is provided with an X-Y-axis driving mechanism, a mounting head 5, and a mounting nozzle. The X-Y-axis driving mechanism drives the mounting head 5 reciprocally between the feeder device 4 and the board using a screw feed mechanism, a linear motor, or the like as a driving source, for example. The mounting head 5 is equipped in an exchangeable manner to a movable member (an equipment position) which is horizontally driven in two axial directions by the X-Y-axis driving mechanism. In the present embodiment, the number of the mounting heads 5 which are equipped to one of the component mounting machines 31 to 34 is set to one (a single head structure). The configuration is not limited thereto, and two mounting heads may be equipped to a single component mounting machine (a twin head structure).

The mounting heads 5 may be largely classified as single nozzle heads or multi nozzle heads. A single nozzle head holds a single mounting nozzle on the bottom face thereof. A multi nozzle head holds a plurality of mounting nozzles at an equal interval on the circular circumference of the bottom face. The mounting nozzle sucks and picks up an electronic component using a negative pressure, and releases the negative pressure at a specified position on the board to mount the electronic component. The mounting head 5 and the mounting nozzle are inter-compatible between the four component mounting machines 31 to 34. Each of the mounting heads 5 is given a head identification code which identifies the individual mounting head 5. The control sections of the component mounting machines 31 to 34 recognizes the head identification code via a communication function between the control section and the mounting head 5. Accordingly, the control sections of the component mounting machines 31 to 34 ascertain the individual mounting head 5 which is equipped. The data of the head identification code is transmitted by communication to the high-order host system 2 and is shared.

The mounting head 5 includes a Z-axis driving mechanism which performs driving to lift or lower the mounting nozzle being held, and a θ-axis driving mechanism which rotationally drives the mounting nozzle. Furthermore, of the mounting heads 5, a multi nozzle head includes an R-axis driving mechanism which rotationally drives a plurality of mounting nozzles on the circular circumference. The mounting head 5 includes an air pressure control mechanism which generates and controls a negative pressure. The Z-axis driving mechanism, the θ-axis driving mechanism, the R-axis driving mechanism, and the air pressure control mechanism are likely to undergo a reduction in performance in accordance with an increase in the actual operation number of mounting the electronic components, that is, in accordance with an increase in an actual shot number Mm. Therefore, it is recommended to perform the maintenance of the mounting head 5 at a point in time at which a number of the electronic components which are mounted is equal to a predetermined defined shot number Mk. The defined shot number Mk is an upper limit value of the recommended operation number in a maintenance interval period, and corresponds to a defined operation number of the present disclosure. Examples of maintenance items of the mounting head 5 and the mounting nozzle include inspection and cleaning of the driving mechanism, replenishing of lubricant in the movable sections, cleaning of the inner portion of air pressure tubes, and the like.

Examples of the feeder identification code, the device code, and the head identification code include bar codes, QR codes (registered trademark), and the like. Naturally, the code reader is a device capable of reading the bar codes, the QR codes (registered trademark), or the like. For each of the feeder devices 4, the past operational history, the present state, the maintenance time, and the like are individually managed using the feeder identification code, and the component type of the reel which is currently being held is ascertained using the device code. For each of the mounting heads 5, the past operational history, the present state, the maintenance time, and the like are individually managed using the head identification code.

The monitor device 61 is arranged on a front side top portion of each of the component mounting machines 31 to 34. The monitor device 61 displays a portion of production job data which is described later, operational states of the component mounting machines 31 to 34, and the like to the worker. An input section for allowing the worker to perform input operations is attached to the monitor device 61. The monitor device 61 also operates as a guide section 13 (described later) of the maintenance management device 1.

The high-order host system 2 controls the overall operation of the board production line by executing a predetermined production program. The high-order host system 2 also operates as the maintenance management device 1 of the embodiment by executing a predetermined maintenance management program. The high-order host system 2 is configured using a general computer device provided with a central calculating section (CPU), a memory section, an input section, an output section, and the like. The high-order host system 2 is connected to be capable of communication with the solder printer, the solder inspector, and the board appearance inspection machine, not illustrated in the drawings, in addition to the four component mounting machines 31 to 34. The high-order host system 2 holds a plurality of types of production job data corresponding to the types of the boards to be produced in the memory section. The production job data includes design information, production information, and test information of the board to be produced.

The design information includes information such as the size of the board, the positions of paste-form solder to be printed onto the board, component type and quantity of the electronic components to be mounted onto the board, and the specified positions at which the electronic components are to be mounted. The production information includes information which allocates the component types of the electronic components to the four component mounting machines 31 to 34 and further allocates the component types to each of the slot positions, information which manages the operations when sucking and mounting the electronic components, and the like. The scheduled production number and production completion scheduled time of the board are often set as the production information. The test information includes information such as the imaging method when imaging and testing the board, the processing method of the image obtained through the imaging, acceptance and rejection criteria, and the like.

The high-order host system 2 transmits a portion of the production job data which is necessary to each device which forms the board production line by communication at a necessary time in a timely manner. The high-order host system 2 acquires data relating to the operational situation from each of the devices via communication transmission. Accordingly, the high-order host system 2 monitors the operational situation of each of the devices, the progress situation of the production, and the like. A time necessary to mount the specified quantity of electronic components onto a single board using each of the component mounting machines 31 to 34, that is, cycle times Tc1 to Tc4 (refer to arrow R1 of FIG. 1) may be exemplified as an index of the operational situation. The cycle times Tc1 to Tc4 are clocked for every operation of each of the component mounting machines 31 to 34, and are transmitted by communication to the high-order host system 2 as depicted by the arrow R1 of FIG. 1. An actual production number of boards for which production is completed may be exemplified as an index of the progress situation.

A head maintenance device 7 is often arranged on the same floor as the component mounting machines 31 to 34; however, the arrangement location is not particularly limited. The head maintenance device 7 performs the maintenance of the mounting head 5 which is carried in and set by the worker. The head maintenance device 7 displays maintenance information including the head identification code and the maintenance result of the mounting head 5 which is subjected to the maintenance on a display panel 71 of a top portion of a front surface. Additionally, the head maintenance device 7 transmits the maintenance information to the high-order host system 2 by communication as illustrated by an arrow R2 of FIG. 1. The maintenance result is ordinarily "good"; however, the maintenance result "bad" may rarely arise in a case in which the performance of the mounting head 5 may not be sufficiently recovered.

A storage container 8 is often arranged on the same floor as the component mounting machines 31 to 34; however, the arrangement location is not particularly limited. The storage container 8 is provided for use in storing a multiplicity of the feeder devices 4 and the mounting heads 5 which are not equipped to the component mounting machines 31 to 34. It is not necessary for the storage container 8 to be a warehouse which is closed off by a housing, and, the storage container 8 may be a storage space which is partitioned within the floor, for example. A monitor device 65 is arranged in the inner portion or the proximity of the door of the storage container 8. The monitor device 65 is connected to be capable of communication with the high-order host system 2. An input section for allowing the worker to perform input operations is attached to the monitor device 65. The monitor device 65 operates as the guide section 13 (described later) of the maintenance management device 1.

Next, description will be given of the maintenance management device 1 of the embodiment which is realized using the maintenance management program of the high-order host system 2. The maintenance management device 1 is provided with a remaining operation number calculating section 11, an operation frequency ascertaining section 12, the guide section 13, and an operation time management section 14. The configuration is not limited to this embodiment, and the maintenance management device 1 may be configured using a separate computer device from the high-order host system 2.

The remaining operation number calculating section 11 calculates a remaining feeder feed number Nr for each of the feeder devices 4 based on the defined feeder feed number Nk and the actual feeder feed number Nm. Specifically, the remaining operation number calculating section 11 subtracts the actual feeder feed number Nm from the defined feeder feed number Nk to calculate the remaining feeder feed number Nr. The remaining feeder feed number Nr means the recommended remaining operation number until the next maintenance. The defined feeder feed number Nk is a determined constant, and is input and set in advance to the remaining operation number calculating section 11 from the input section of the high-order host system 2. There is a case in which the defined feeder feed number Nk differs depending on the type and the structure of the feeder device 4.

Meanwhile, the actual feeder feed number Nm is a variable which is set to an initial value when the corresponding feeder device 4 is subjected to maintenance, and is incremented every time the feeder device 4 is operated. The initial value is ordinarily set to zero; however, the configuration is not limited thereto. The worker inputs the feeder identification code of the feeder device 4 which is subjected to the maintenance from the input section of the high-order host system 2. The remaining operation number calculating section 11 sets the actual feeder feed number Nm, which corresponds to the corresponding feeder identification code, to the initial value as the initial settings after the maintenance is performed.

The feeder device 4 is equipped to any slot position of any of the component mounting machines 31 to 34 and performs a supplying operation of the electronic component. As illustrated by the arrow R1 of FIG. 1, the remaining operation number calculating section 11 acquires the actual feeder feed number Nm of the corresponding feeder device 4 together with the feeder identification code from the component mounting machines 31 to 34. In this case, the remaining operation number calculating section 11 may directly acquire the numerical information of the actual feeder feed number Nm. Alternatively, the remaining operation number calculating section 11 may acquire information (for example, pulse signal information) indicating that the feeder device 4 is operated every time, and perform a count-up process to obtain the actual feeder feed number Nm. The remaining operation number calculating section 11 forms sets of the feeder identification codes of each of the feeder devices 4 and the remaining feeder feed numbers Nr which are obtained by calculation and stores the sets. In a period in which the feeder devices 4 are removed from the component mounting machines 31 to 34, the actual feeder feed number Nm and the remaining feeder feed number Nr do not change.

The remaining operation number calculating section 11 calculates each remaining shot number Mr for the respective mounting heads 5 based on the defined shot number Mk and the actual shot number Mm. Specifically, the remaining operation number calculating section 11 subtracts the actual shot number Mm from the defined shot number Mk to calculate the remaining shot number Mr. The remaining shot number Mr means the recommended remaining operation number until the next maintenance. The defined shot number Mk is a determined constant, and is input and set in advance to the remaining operation number calculating section 11 from the input section of the high-order host system 2. There is a case in which the defined shot number Mk differs depending on the type and the structure of the mounting head 5.

Meanwhile, the actual shot number Mm is a variable which is set to an initial value when the corresponding mounting head 5 is subjected to maintenance, and is incremented every time the mounting head 5 is operated. The initial value is ordinarily set to zero; however, the configuration is not limited thereto. The mounting head 5 is carried by the worker to the head maintenance device 7 and subjected to maintenance. As depicted by the arrow R2 of FIG. 1, the head maintenance device 7 transmits maintenance information including the head identification code and the maintenance result of the mounting head 5 which is subjected to the maintenance to the high-order host system 2 by communication. The remaining operation number calculating section 11 sets the initial value to the actual shot number Mm corresponding to the head identification code as the initial settings after the maintenance is performed, with the premise that the maintenance result is "good".

The mounting head 5 is equipped to any of the component mounting machines 31 to 34 and performs a mounting operation of the electronic component. As illustrated by the arrow R1 of FIG. 1, the remaining operation number calculating section 11 acquires the actual shot number Mm of the corresponding mounting head 5 together with the head identification code from the component mounting machines 31 to 34. In this case, the remaining operation number calculating section 11 may directly acquire the numerical information of the actual shot number Mm. Alternatively, the remaining operation number calculating section 11 may acquire information (for example, pulse signal information) indicating that the mounting head 5 is operated every time, and perform a count-up process to obtain the actual shot number Mm. The remaining operation number calculating section 11 forms sets of the head identification codes of each of the mounting heads 5 and the remaining shot numbers Mr which are obtained by calculation and stores the sets. In a period in which the mounting heads 5 are removed from the component mounting machines 31 to 34, the actual shot number Mm and the remaining shot number Mr do not change.

The operation frequency ascertaining section 12 ascertains the frequency at which the feeder devices 4 which are equipped to each of the slots of the four component mounting machines 31 to 34 operate corresponding to the type of the board to be produced, that is, ascertains a feeder feed frequency n. The operation frequency ascertaining section 12 ascertains the frequency at which the mounting heads 5 which are equipped to each of the four component mounting machines 31 to 34 operate corresponding to the type of the board to be produced, that is, ascertains a shot frequency m. The operation frequency ascertaining section 12 easily ascertains the feeder feed frequency n and the shot frequency m based on the production job data described earlier corresponding to the type of the board.

When the worker equips the feeder devices 4 to the slots of the component mounting machines 31 to 34, the guide section 13 performs guidance of the component mounting machines 31 to 34 to which the feeder devices 4 are to be equipped and the slot positions thereof based on the remaining feeder feed number Nr and the feeder feed frequency n. When the worker equips the mounting heads 5 to the component mounting machines 31 to 34, the guide section 13 performs guidance of the component mounting machines 31 to 34 to which the mounting heads 5 are to be mounted based on the remaining shot numbers Mr and the shot frequencies m. The guide section 13 is configured by disposing the monitor device 65 in the storage container 8 and disposing the monitor devices 61 in the component mounting machines 31 to 34. The guide section 13 selects the feeder device 4 and the mounting head 5, and the guide information indicating the equipment positions thereof is for guiding the worker. The guide information is displayed on both of the two monitor devices 61 to 65. The details of the determination method and the display method of the guide information by the guide section 13 will be described later together with the operations of the maintenance management device 1 and the work content of the worker.

The operation time management section 14 manages the cycle times Tc1 to Tc4 which are transmitted by communication from the component mounting machines 31 to 34. Since the mounting head 5 is apt to become worn or exhausted in accordance with an increase in the actual shot number Mm, a tendency to slight delay arises in the cycle times Tc1 to Tc4. For example, the lubricant of the driving mechanism is insufficient, the sliding surfaces become rough, and the like, and the drive speed is apt to decrease. Therefore, an upper limit allowable operation time is preset and held in the operation time management section 14 as a management value of the cycle times Tc1 to Tc4.

It is ideal for the cycle times Tc1 to Tc4 to be the same in all of the component mounting machines 31 to 34, and the production job data is created using this as an optimization target. However, unbalances arise depending on the type of the board, and a case in which the cycle times Tc1 to Tc4 differ from each other between the component mounting machines 31 to 34 may not be avoided. In the operation time management section 14, when any of the cycle times Tc1 to Tc4, which are clocked by each of the component mounting machines 31 to 34, exceeds the allowable operation time, guidance is provided to perform the maintenance of the mounting head 5 of the corresponding component mounting machine regardless of the remaining shot number Mr. The guide information is displayed on the monitor device 61 of the component mounting machines 31 to 34.

Next, description will be given of the operations of the maintenance management device 1 of the embodiment and the work content of the worker. FIG. 2 is a sequence flow diagram explaining the operations of the maintenance management device 1 of the component mounting machine of the embodiment and the work content of the worker. FIG. 2 exemplifies the setup changing work when changing the type of the board to be produced. Of the four columns lined up horizontally in FIG. 2, the leftmost column illustrates the work content of the worker. The second column from the left illustrates the operations of the high-order host system 2 as the maintenance management device 1. The third column from the left illustrates the operations of the monitor device 61 of the component mounting machines 31 to 34 as the guide section 13. The rightmost column illustrates the operations of the monitor device 65 of the storage container 8 as the guide section 13. The passage of time is illustrated from top to bottom in FIG. 2.

Figure 2:
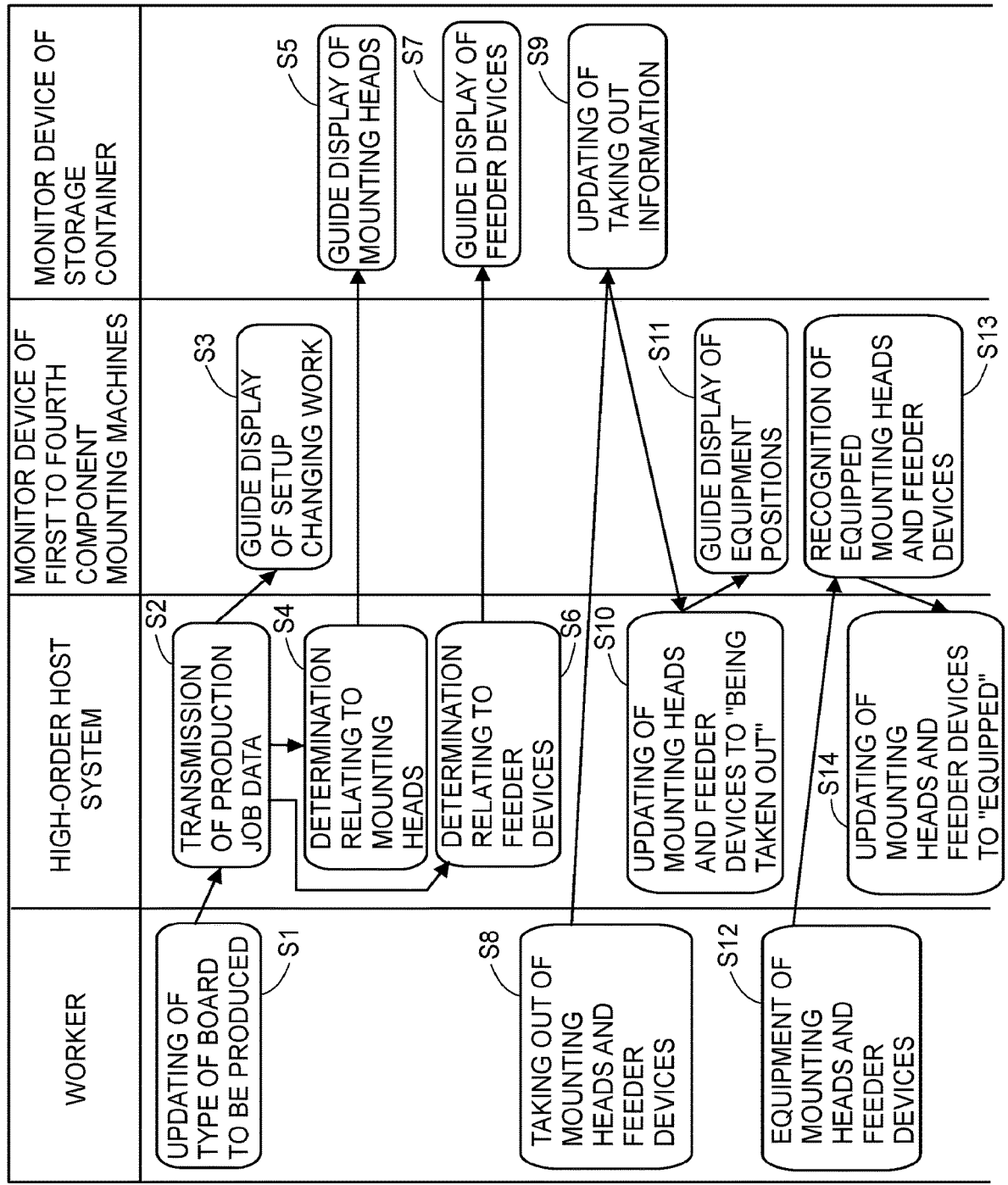
FIG. 2 is a sequence flow diagram explaining operations of the maintenance management device of the component mounting machine of the embodiment and work content of a worker.

In sequence S1 of FIG. 2, the worker changes the type of the board to be produced. The worker switches and sets the old production job for the new production job from the input section of the high-order host system 2 to perform the changing work. Accordingly, in sequence S2, the high-order host system 2 transmits the new production job data which replaces the old production job data to each of the device of the board production line by communication (refer to arrow R3 of FIG. 1). In sequence S3, the monitor device 61 of the component mounting machines 31 to 34 displays guidance to the worker such that the worker performs the setup changing work for changing the type of the board to be produced.

Next, in sequence S4, the maintenance management device 1 performs determination relating to the mounting heads 5 to be equipped in the new production job data. As a specific first example, a case is considered in which the mounting heads 5 which are equipped to the component mounting machines 31 to 34 based on the old production job data may be used without change in the new production job data. In this case, the maintenance management device 1 determines that it is not necessary to exchange and equip the mounting heads 5. As a second example, a case is considered in which the mounting heads 5 are exchanged in the first and second component mounting machines 31 and 32 in accordance with the change from the old production job data to the new production job data. In this case, the remaining operation number calculating section 11, the operation frequency ascertaining section 12, and the guide section 13 of the maintenance management device 1 operate in cooperation.

Furthermore, in the second example, consideration is given to simple conditions in which the candidates of the mounting heads 5 to be newly equipped to the first and second component mounting machines 31 and 32 are limited to the two mounting heads, A mounting head 5A, and B mounting head 5B. The A mounting head 5A and the B mounting head 5B are stored in the storage container 8, are of the same model, and are inter-compatible. Therefore, in the related art, the A mounting head 5A may be equipped to the first component mounting machine 31 and the B mounting head 5B may be equipped to the second component mounting machine 32, and conversely, the B mounting head 5B may be equipped to the first component mounting machine 31 and the A mounting head 5A may be equipped to the second component mounting machine 32.

In contrast, in the present embodiment, the guide section 13 specifies the component mounting machines to which to equip the A mounting head 5A and the B mounting head 5B and performs guidance based on remaining shot numbers MrA and MrB of the A mounting head 5A and the B mounting head 5B, and shot frequencies m1 and m2 of the first component mounting machine 31 and the second component mounting machine 32. Here, the remaining shot number MrA of the A mounting head 5A and the remaining shot number MrB of the B mounting head 5B are calculated by the remaining operation number calculating section 11. For example, the remaining shot number MrA of the A mounting head 5A is set to be smaller than the remaining shot number MrB of the B mounting head 5B. The shot frequency m1 of the first component mounting machine 31 and the shot frequency m2 of the second component mounting machine 32 are ascertained by the operation frequency ascertaining section 12. For example, the shot frequency m1 of the first component mounting machine 31 is set to be smaller than the shot frequency m2 of the second component mounting machine 32.

The guide section 13 determines that the A mounting head 5A with the smaller remaining shot number MrA is to be equipped to the first component mounting machine 31 with the lower shot frequency m1, and that the B mounting head 5B with the greater remaining shot number MrB is to be equipped to the second component mounting machine 32 with the higher shot frequency m2. In sequence S5, the guide section 13 transmits guide information which selects the constituent elements among the guide information to the monitor device 65 of the storage container 8 by communication based on the determination results (refer to arrow R4 of FIG. 1), and displays the guide information. Specifically, the guide section 13 performs guide display of the head identification codes of the A mounting head 5A and the B mounting head 5B as the constituent elements to be equipped. Furthermore, at this point in time, it is not necessary to display the correspondence relationship between the A mounting head 5A and the B mounting head 5B, and the first component mounting machine 31 and the second component mounting machine 32.

Next, in sequence S6, the maintenance management device 1 performs determination relating to the feeder devices 4 to be equipped in the new production job data. First, the maintenance management device 1 creates a list of the new component types of the electronic components which are necessary in the new production job data, the necessary number of feeder devices 4 holding the reels of the corresponding component types, and the slot positions to be equipped. Next, the maintenance management device 1 searches for the feeder device 4 which is stored in the storage container 8 and is holding the reel of the corresponding component type. The searching is easily performed based on the correspondence relationship between the device code and the feeder identification code which are ascertained. If the number of feeder devices 4 which are holding the reel of the corresponding component type is sufficient to meet the necessary number, the searching is ended. In a case in which the number of feeder devices 4 is insufficient, the maintenance management device 1 searches for the feeder device 4 which is stored in the storage container 8 and is capable of holding the reel of the corresponding component type until the necessary number is satisfied. In this case, it becomes necessary for the worker setting the reel of the corresponding component type in the reel holding section to work by the amount of the insufficient number of the feeder devices 4.

Next, consideration is given to a third example as an example of a point in time at which the searching is completed and the candidates of the feeder devices 4 to be equipped in the new production job data are listed. FIG. 3 is an explanatory diagram of the third example of the maintenance management device 1 of the component mounting machine of the embodiment exemplifying functions of the guide section 13. In the third example, the equipment of the four feeder devices 4 is necessary in order to supply the electronic components of certain component types according to the new production job data. The equipment positions of the four feeder devices 4 are defined as a slot S1 of the first component supply device 31, a slot S2 of the second component supply device 32, a slot S3 of the third component supply device 33, and a slot S4 of the fourth component supply device 34.

Figure 3:
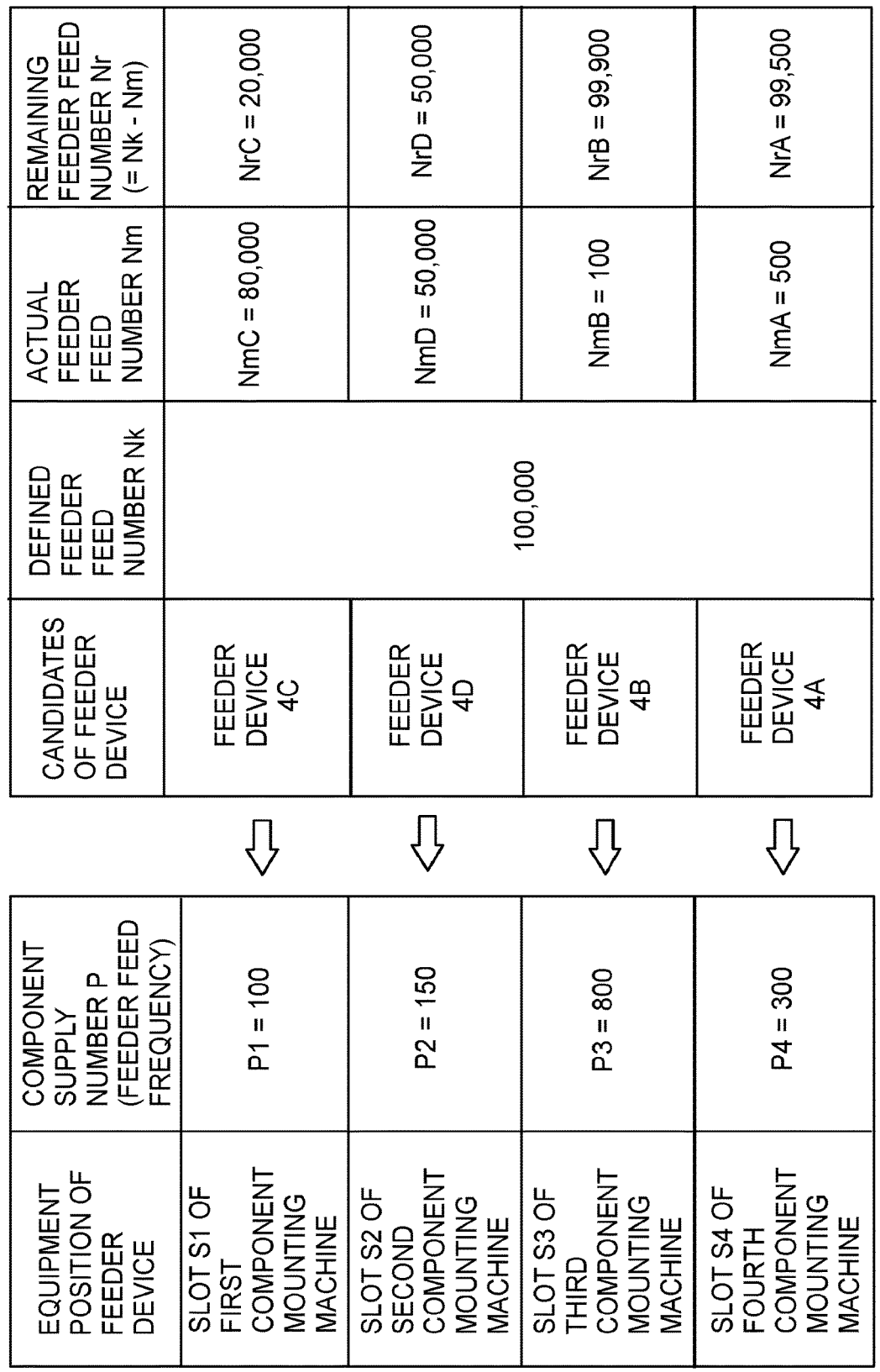
FIG. 3 is a diagram explaining a third example of the maintenance management device of the component mounting machine of the embodiment exemplifying functions of a guide section.

Component supply numbers P which are defined in the new production job data for the slots S1 to S4 are P1=100, P2=150, P3=800, and P4=300 as illustrated in FIG. 3. Therefore, the operation frequency ascertaining section 12 is capable of ascertaining the feeder feed frequencies which are proportional to the component supply numbers P1 to P4 of the slots S1 to S4. For example, the feeder feed frequency is greatest in the slot S3 of the third component mounting machine 33 with the greatest component supply number P3=800, and the feeder feed frequency is smallest in the slot S1 of the first component mounting machine 31 with the smallest component supply number P1=100. In the third example, instead of the feeder feed frequencies, the guide section 13 uses the component supply numbers P1 to P4 which may be treated in the same manner as the feeder feed frequencies.

Meanwhile, by searching, the four feeder devices 4A to 4D are listed as candidates of the feeder devices 4 to be equipped to the slots S1 to S4. The four feeder devices 4A to 4D are stored in the storage container 8, are of the same model, and are inter-compatible. Therefore, in the related art, any of the feeder devices 4A to 4D may be equipped to any of the slots S1 to S4.

In contrast, in the present embodiment, the guide section 13 specifies the slots S1 to S4 to which the feeder devices 4A to 4D are to be equipped and performs guidance based on remaining feeder feed numbers NrA to NrD of the four feeder devices 4A to 4D, and the component supply numbers P1 to P4 of the four slots S1 to S4. Here, the defined feeder feed numbers Nk of the four feeder devices 4A to 4D are the same and are all equal to 100000. The actual feeder feed numbers Nm of the four feeder devices 4A to 4D are acquired as NmA=500, NmB=100, NmC=80000, and NmD=50000, respectively. Therefore, the remaining feeder feed numbers Nr which are calculated by the remaining operation number calculating section 11 become NrA=99500, NrB=99900, NrC=20000, and NrD=50000, respectively.

The guide section 13 determines that the greater the remaining feeder feed number Nr of the feeder device 4, the greater the component supply number P of the slot to which the feeder device 4 is equipped, and that the smaller the remaining feeder feed number Nr of the feeder device 4, the smaller the component supply number P of the slot to which the feeder device 4 is equipped. In the example of FIG. 3, as illustrated by the white-filled arrows, the guide section 13 determines that the feeder device 4B is to be equipped to the slot S3 of the third component mounting machine, and that the feeder device 4C is to be equipped to the slot S1 of the first component mounting machine 31. The guide section 13 determines that the feeder device 4A is to be equipped to the slot S4 of the fourth component mounting machine, and that the feeder device 4D is to be equipped to the slot S2 of the second component mounting machine 32.

In sequence S7 of FIG. 2, the guide section 13 displays guide information which selects the constituent elements among the guide information on the monitor device 65 of the storage container 8 based on the determination results (refer to arrow R4 of FIG. 1). Specifically, the guide section 13 performs guide display of the feeder identification codes of the four feeder devices 4A to 4D as the constituent elements to be equipped. At this point in time, it is not necessary to display the correspondence relationship between the four feeder devices 4A to 4D and the four slots S1 to S4.

Next, in sequence S8, the worker moves to the storage container and checks the guide information which is displayed on the monitor device 65. By following the guidance of the guide information, the worker is capable of taking out the two mounting heads 5A and 5B of the second example and the four feeder devices 4A to 4D of the third example without making any mistakes (refer to arrows R5 and R6 of FIG. 1). Next, in sequence S9, the worker updates and inputs the taking out information indicating that the two mounting heads 5A and 5B and the four feeder devices are taken out from the input section of the monitor device 65.

Accordingly, in sequence S10, the high-order host system 2 updates the current state of the two mounting heads 5A and 5B, and the four feeder devices from "stored in the storage container 8" to "being taken out". Next, in sequence S11, the high-order host system 2 displays the guide information relating to the equipment positions of the constituent elements on the monitor devices 61 of the four component mounting machines 31 to 34 (refer to arrow R3 of FIG. 1). Specifically, the monitor device 61 associates the head identification code of the A mounting head 5A with the first component mounting machine 31 and associates the head identification code of the B mounting head 5B with the second component mounting machine 32 and performs guide display. The monitor device 61 performs guidance display of the four sets of correspondence relationships illustrated in FIG. 3, for example, the correspondence relationship between the slot S1 of the first component mounting machine 31 and the feeder identification code of the feeder device 4C.

Next, in sequence S12, the worker carries the two mounting heads 5A and 5B and the four feeder devices, faces the component mounting machines 31 to 34, and checks the guide information which is displayed on the monitor device 61. By following the guidance of the guide information, the worker is capable of equipping the two mounting heads 5A and 5B and the four feeder devices to the guided equipment positions of the component mounting machines 31 to 34 without making any mistakes (refer to arrow R7 of FIG. 1). Next, in sequence S13, the control sections of the component mounting machines 31 to 34 check that the two mounting heads 5A and 5B and the four feeder devices 4A to 4D are equipped. The information indicating that the two mounting heads 5A and 5B and the four feeder devices 4A to 4D are equipped is transmitted by communication to the high-order host system 2 and shared.

In sequence S14, the high-order host system 2 checks that the two mounting heads 5A and 5B and the four feeder devices 4A to 4D are equipped at the guided equipment positions. The high-order host system 2 updates the current state of the two mounting heads 5A and 5B, and the four feeder devices from "being taken out" to "equipped". Subsequently, the production of the board is started based on the new production job data.

There is a case in which the number of candidates of the constituent elements (the feeder devices 4 or the mounting heads 5) capable of being equipped is greater than the number of equipment positions in the setup changing work. In this case, the guide section 13 performs guidance to prioritize and equip the constituent elements with high remaining feeder feed numbers Nr and remaining shot numbers Mr.

There is a case in which, during the production of the board, the feeder device 4 or the mounting head 5 reaches the maintenance time in any of the four component mounting machines 31 to 34. Even in this case, when there are a plurality of candidates for exchangeable elements (the feeder devices 4 or the mounting heads 5), the guide section 13 is capable of selecting the suitable exchangeable element based on the remaining feeder feed number Nr or the remaining shot number Mr, and the operation frequency of the equipment position. For example, the guide section 13 selects an exchangeable element which has an actual operation number close to the actual feeder feed number Nm of the other feeder device 4 which is already equipped or the actual shot number Mm of the other mounting head 5 which is already equipped and performs guidance. For example, alternatively, the guide section 13 selects the candidate in which the remaining feeder feed number Nr or the remaining shot number Mr is greatest among the plurality of candidates of the exchangeable elements and performs guidance.

When the selecting and the equipping of the constituent elements as described above are repeated, it is possible to use the plurality of constituent elements in a harmonized manner. Accordingly, the actual operation numbers of the plurality of constituent elements are similar to each other, and reaching of the maintenance times becomes closer. The extent of wear and exhaustion of the plurality of constituent elements becomes more similar. Accordingly, the performance is matched across the four component mounting machines 31 to 34 to which the plurality of constituent elements are equipped. Hypothetically, if a favorable mounting head 5 is equipped to the first component mounting machine 31 directly after performing the maintenance and a worn mounting head 5 with a near next maintenance time is equipped to the second component mounting machine 32, a large difference arises between the two cycle times Tc1 and Tc2. In this case, the production efficiency of the entirety of the component mounting line 3 is reduced due to being restricted by the delayed cycle time Tc2 of the second component mounting machine 32.

The maintenance management device 1 of the component mounting machine of the embodiment individually manages maintenance times at which to perform maintenance and performs guidance of the reaching the maintenance times using constituent elements (the feeder devices 4 and the mounting heads 5) which are equipped in an exchangeable manner to a plurality of equipment positions of the four component mounting machines 31 to 34 which mount electronic components onto a board as targets and operate. The maintenance management device 1 is provided with the remaining operation number calculating section 11 which, for the plurality of constituent elements, uses an upper limit value of an operation number recommended in an interval period of the maintenance as the defined operation numbers Nk and Mk, uses a number of operations since the previous maintenance as the actual operation numbers Nm and Mm, and calculates the remaining operation numbers Nr and Mr of each of the constituent elements based on the defined operation numbers Nk and Mk and the actual operation numbers Nm and Mm, the operation frequency ascertaining section 12 which ascertains respective operation frequencies n and m (or the component supply number P) of the constituent elements at the plurality of equipment positions according to a type of the board, and the guide section 13 which performs guidance of equipment positions of the constituent elements based on the remaining operation numbers Nr and Mr and the operation frequencies n and m (or the component supply number P) when a worker equips the constituent elements as a result of a change in the type of the board, or, as a result of a portion of the constituent elements which are equipped to the equipment positions reaching the maintenance time.

Accordingly, the guide section 13 performs guidance of the equipment positions of the constituent elements in consideration of the remaining operation numbers Nr and Mr recommended until the next maintenance of the constituent elements, and the operation frequencies n and m (or the component supply number P) at the equipment positions. Therefore, the worker is capable of equipping the constituent elements to the equipment positions according to the guidance for which the maintenance times are considered, and the efficiency of the maintenance of the constituent elements is improved. The improvement in the efficiency of the maintenance contributes to an improvement in production efficiency.

In the maintenance management device 1 of the embodiment, when the worker equips two or more constituent elements, the guide section 13 performs guidance to equip the constituent elements with small remaining operation numbers Nr and Mr to equipment positions with low operation frequencies n and m (or the component supply number P), and to equip constituent elements with large remaining operation numbers Nr and Mr to equipment positions with high operation frequencies n and m (or the component supply number P) using the monitor device 61. In addition, the remaining operation number calculating section 11 subtracts the actual operation numbers Nm and Mm from the defined operation numbers Nk and Mk to calculate the remaining operation numbers Nr and Mr.

Accordingly, the remaining operation numbers Nr and Mr of the two or more constituent elements gradually become closer. For example, in FIG. 3, the feeder device 4C in which only 20000 remains of the remaining feeder feed number NrC is equipped to the equipment position in which the component supply number P1 is the smallest value, and a reduction in the remaining feeder feed number NrC is suppressed. Meanwhile, the feeder device 4B in which 99900 remains of the remaining feeder feed number NrB is equipped to the equipment position in which the component supply number P3 is the largest value, and a reduction in the remaining feeder feed number NrB is promoted. If the selection of the constituent elements and the determination of the equipment positions are continued using this method, the remaining feeder feed numbers NrA to NrD of the multiple feeder devices 4 become closer to each other. Therefore, the maintenance of the plurality of feeder devices 4 approaches the same time. This also applies to the plurality of mounting heads 5.

Here, as is well known, since the remaining operation numbers Nr and Mr are not strict, the maintenance may be performed even if some of the remaining operation numbers Nr and Mr remain. Accordingly, it is possible to perform the maintenance of a plurality of constituent elements together at the same time. In other words, it is possible to increase the concentration of maintenance times and increase the efficiency of the maintenance, and the labor of the worker is also reduced. The extent of wear and exhaustion of the plurality of constituent elements becomes similar.

Accordingly, the performance is matched across the four component mounting machines 31 to 34 to which the plurality of constituent elements are equipped, and the deviation between the cycle times Tc1 to Tc4 is reduced. Therefore, according to the overall effect of the concentration of the maintenance times and the reduction in the deviation in the cycle times Tc1 to Tc4, it is possible to contribute to an improvement in production efficiency.

In the maintenance management device 1 of the embodiment, the monitor device 65 is disposed on the storage container 8 which stores the plurality of constituent elements (the feeder devices 4 and the mounting heads 5), and the monitor device 61 is disposed on the component mounting machine to configure the guide section 13.

Accordingly, the worker is capable of checking the guide information relating to the selection and the equipment positions of the constituent elements to be equipped at a nearby position. Therefore, the work efficiency improves, and concerns of picking up the wrong constituent elements, using the wrong equipment positions, and the like are reduced.

In the maintenance management device 1 of the embodiment, feeder identification codes are given to the feeder devices 4, head identification codes are given to the mounting heads 5, and the maintenance times are individually managed using these identification codes.

Accordingly, it is possible to realize the maintenance management device 1 using a computer device such as the high-order host system 2. Therefore, savings are made in the labor of individually managing the maintenance times, and the reliability of the management is high.

In the maintenance management device 1 of the embodiment, the remaining operation number calculating section 11 receives the feeder identification codes and the actual feeder feed numbers Nm of the feeder devices 4 which are equipped to the component mounting machines 31 to 34 in addition to the head identification codes and the actual shot numbers Mm of the mounting heads 5 from the component mounting machines 31 to 34.

Accordingly, it is possible to automatically manage the remaining feeder feed numbers Nr in addition to the remaining shot numbers Mr. Therefore, large savings are made in the labor of managing, and the reliability of the management is improved.

In the maintenance management device 1 of the embodiment, the remaining operation number calculating section 11 receives the head identification code of the mounting head 5 which is subjected to maintenance from the head maintenance device 7 which handles the maintenance of the mounting head 5, and sets the actual operation number Mm of the corresponding mounting head 5 to an initial value (ordinarily zero).

Accordingly, the initial setting of the actual operation number Mm is automatically performed after performing the maintenance of the mounting head 5. Therefore, still larger savings are made in the labor of managing, and the initial setting is reliably performed.

The maintenance management device 1 of the embodiment is further provided with the operation time management section 14. In the operation time management section 14, when any of the cycle times Tc1 to Tc4, which are required for the operation of each of the component mounting machines 31 to 34, exceeds the preset allowable operation time, guidance is provided to perform the maintenance of the mounting head 5 which is equipped to the corresponding component mounting machine regardless of the remaining shot number Mr.

Accordingly, in a case in which the performance of the mounting head 5 is reduced sooner than the maintenance time, it is possible to perform the maintenance regardless of the remaining shot number Mr to obtain a recovery of the performance. Therefore, it is possible to suppress the reduction in the production efficiency.

In the embodiment, the maintenance is performed using the mounting head 5 as a unit; however, the maintenance may be performed using the mounting nozzle as a unit. Consideration is given to also using a different method from that of the embodiment in the selection of the constituent elements and the determination of the equipment positions. For example, when the lot production is completed and the setup changing work to the next lot in which the type of the board is different is performed, a different method in which it is possible to perform the maintenance of the plurality of constituent elements together may be employed. In the different method, the guide section 13 selects the constituent elements to be equipped and determines the equipment positions thereof in consideration of the scheduled production number or the actual production number of boards, and the like.

The operation time management section 14 manages the cycle times Tc1 to Tc4 which are required for the mounting of the specified amount of electronic components onto a single board using the component mounting machines 31 to 34; however, a different method may be considered. For example, the required time for the mounting head 5 to suck the electronic component at the feeder device 4, move to the board, mount the electronic component, and return to the feeder device 4 is referred to as the mounting cycle time. The operation time management section 14 may guide the maintenance of the mounting head 5 based on the delay tendencies of the mounting cycle time.

The feeder devices 4 and the mounting heads 5 which are the management targets of the maintenance management device 1 of the embodiment may be exchanged and equipped to a component mounting machine of a different board production line. In this case, the high-order host system 2 acquires the actual feeder feed numbers Nm of the feeder devices 4 and the actual shot numbers Mm of the mounting heads 5 from a plurality of board production lines. The maintenance management device 1 of the embodiment may be embodied as a maintenance management method. Even in a case in which the maintenance management device 1 is embodied as a method, the same effects arise as in the maintenance management device 1. It is possible to apply various other adaptations and modifications to the present disclosure.

REFERENCE SIGNS LIST

1: maintenance management device of component mounting machine, 11: remaining operation number calculating section, 12: operation frequency ascertaining section, 13: guide section, 14: operation time management section, 2: high-order host system, 3: component mounting line, 31 to 34: first to fourth component mounting machines, 4, 4A to 4D: feeder device, 5, 5A, 5B: mounting head, 61: monitor device, 65: monitor device, 7: head maintenance device, 8: storage container.

The invention claimed is:

1. A non-transitory computer readable medium storing instructions for individually managing maintenance times at which to perform maintenance and performing guidance of reaching the maintenance times using, as management targets, a plurality of constituent elements which are equipped in an exchangeable manner to a plurality of equipment positions of one or more component mounting machines which mount electronic components onto a board and operate, the instructions, which when executed by a computer, cause the computer to perform a method comprising:
for the plurality of constituent elements, using an upper limit value of an operation number recommended in an interval period of the maintenance as a defined operation number, using a number of operations since a previous maintenance as an actual operation number, and calculating a remaining operation number of each of the constituent elements based on the defined operation number and the actual operation number;
ascertaining respective operation frequencies of the constituent elements at the plurality of equipment positions according to a type of the board; and
performing guidance of guiding the constituent elements to the equipment positions of the one or more component mounting machines based on the remaining operation number and the operation frequency when a worker equips the constituent elements as a result of a change in the type of the board, or, as a result of a portion of the constituent elements which are equipped to the equipment positions reaching the maintenance time,
wherein when the worker equips two or more constituent elements, the performing guidance includes:
guiding equipment positions with low operation frequencies to be equipped with constituent elements with small remaining operation numbers, and
guiding equipment positions with high operation frequencies to be equipped with constituent elements with large remaining operation numbers.

2. The non-transitory computer readable medium according to claim 1, wherein the method further comprises subtracting the actual operation number from the defined operation number to calculate the remaining operation number.

3. The non-transitory computer readable medium according to claim 1, wherein the performing guidance includes controlling a display disposed on at least one of a storage container which stores the plurality of constituent elements and a component mounting machine.

4. The non-transitory computer readable medium according to claim 1, wherein
the plurality of constituent elements each include an identification code which identifies the individual constituent element, and
the maintenance times of the plurality of constituent elements are individually managed using the identification codes.

5. The non-transitory computer readable medium according to claim 4, wherein the method further comprises receiving the identification code and the actual operation number of a constituent element which is equipped to a component mounting machine from the component mounting machine.

6. The non-transitory computer readable medium according to claim 4, wherein the method further comprises receiving the identification code of a constituent element which is subjected to maintenance from a maintenance device which handles the maintenance of the constituent element, and setting an actual operation number of the constituent element to an initial value.

7. The non-transitory computer readable medium according to claim 1, the method further comprising:
when a preset operation time required for operation of a constituent element or a component mounting machine exceeds an allowable operation time, performing guidance to perform maintenance of at least a portion of the constituent element or the constituent element which is equipped to the component mounting machine regardless of the remaining operation number.

8. The non-transitory computer readable medium according to claim 1, wherein the constituent elements include any of a component supply device which supplies the electronic components, a mounting nozzle which mounts the electronic components to specified positions on the board, and a mounting head which holds one or more of the mounting nozzles and moves reciprocally between the component supply device and the board.

9. The non-transitory computer readable medium according to claim 1, wherein the performing guidance includes guiding the constituent elements to the equipment positions of the one or more component mounting machines such that times in which the constituent elements reach their respective maintenance time become closer to one another.

10. A maintenance management method of individually managing maintenance times at which to perform maintenance and performing guidance of reaching the maintenance times using, as management targets, a plurality of constituent elements which are equipped in an exchangeable manner to a plurality of equipment positions of one or more component mounting machines which mount electronic components onto a board and operate, the method comprising:

for the plurality of constituent elements, using an upper limit value of an operation number recommended in an interval period of the maintenance as a defined operation number, using a number of operations since a previous maintenance as an actual operation number, and calculating a remaining operation number of each of the constituent elements based on the defined operation number and the actual operation number;

ascertaining respective operation frequencies of the constituent elements at the plurality of equipment positions according to a type of the board; and performing guidance of guiding the constituent elements to the equipment positions of the one or more component mounting machines based on the remaining operation number and the operation frequency when a worker equips the constituent elements as a result of a change in the type of the board, or, as a result of a portion of the constituent elements which are equipped to the equipment positions reaching the maintenance time, wherein when the worker equips two or more constituent elements, the performing guidance includes:

guiding equipment positions with low operation frequencies to be equipped with constituent elements with small remaining operation numbers, and guiding equipment positions with high operation frequencies to be equipped with constituent elements with large remaining operation numbers.

11. A maintenance management device individually managing maintenance times at which to perform maintenance and performing guidance of reaching the maintenance times using, as management targets, a plurality of constituent elements which are equipped in an exchangeable manner to a plurality of equipment positions of one or more component mounting machines which mount electronic components onto a board and operate, the maintenance management device comprising:

at least one processor configured to:

use an upper limit value of an operation number recommended in an interval period of the maintenance as a defined operation number, use a number of operations since a previous maintenance as an actual operation number, and calculate a remaining operation number of each of the constituent elements based on the defined operation number and the actual operation number;

ascertain respective operation frequencies of the constituent elements at the plurality of equipment positions according to a type of the board; and perform guidance of guiding the constituent elements to the equipment positions of the one or more component mounting machines based on the remaining operation number and the operation frequency when a worker equips the constituent elements as a result of a change in the type of the board, or, as a result of a portion of the constituent elements which are equipped to the equipment positions reaching the maintenance time, wherein when the worker equips two or more constituent elements, the at least one processor is configured to perform guidance of:

guiding equipment positions with low operation frequencies to be equipped with constituent elements with small remaining operation numbers, and guiding equipment positions with high operation frequencies to be equipped with constituent elements with large remaining operation numbers.

12. The maintenance management device according to claim 11, wherein the at least one processor is configured to subtract the actual operation number from the defined operation number to calculate the remaining operation number.

13. The maintenance management device according to claim 11, wherein the at least one processor is configured to perform the guidance using a display disposed on at least one of a storage container which stores the plurality of constituent elements and a component mounting machine.

14. The maintenance management device according to claim 11, wherein the plurality of constituent elements each include an identification code which identifies the individual constituent element, and the maintenance times of the plurality of constituent elements are individually managed using the identification codes.

15. The maintenance management device according to claim 14, wherein the at least one processor is configured to receive the identification code and the actual operation number of a constituent element which is equipped to a component mounting machine from the component mounting machine.

16. The maintenance management device according to claim 14, wherein the at least one processor is configured to:

receive the identification code of a constituent element which is subjected to maintenance from a maintenance device which handles the maintenance of the constituent element, and set an actual operation number of the constituent element to an initial value.

17. The maintenance management device according to claim 11, wherein the at least one processor is configured to, when a preset operation time required for operation of a constituent element or a component mounting machine exceeds an allowable operation time, perform guidance to perform maintenance of at least a portion of the constituent element or the constituent element which is equipped to the component mounting machine regardless of the remaining operation number.

18. The maintenance management device according to claim 11, wherein the constituent elements include any of a component supply device which supplies the electronic components, a mounting nozzle which mounts the electronic components to specified positions on the board, and a mounting head which holds one or more of the mounting nozzles and moves reciprocally between the component supply device and the board.

19. The maintenance management device according to claim 11, wherein the at least one processor is configured guide the constituent elements to the equipment positions of the one or more component mounting machines such that times in which the constituent elements reach their respective maintenance time become closer to one another.

* * * * *